(12) United States Patent
Chen et al.

(10) Patent No.: US 10,090,260 B2
(45) Date of Patent: Oct. 2, 2018

(54) SEMICONDUCTOR APPARATUS WITH FAKE FUNCTIONALITY

(71) Applicant: eMemory Technology Inc., Hsinchu (TW)

(72) Inventors: Hsin-Ming Chen, Hsinchu (TW); Lun-Chun Chen, Yilan County (TW); Meng-Yi Wu, Hsinchu County (TW); Chih-Hao Huang, Taichung (TW); Tung-Cheng Kuo, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 0 days.

(21) Appl. No.: 15/387,609

(22) Filed: Dec. 21, 2016

(65) Prior Publication Data

US 2017/0301634 A1    Oct. 19, 2017

Related U.S. Application Data

(60) Provisional application No. 62/322,237, filed on Apr. 13, 2016.

(51) Int. Cl.
| | |
|---|---|
| *H01L 23/00* | (2006.01) |
| *H01L 23/522* | (2006.01) |
| *H01L 27/088* | (2006.01) |
| *H01L 29/06* | (2006.01) |
| *G11C 16/14* | (2006.01) |

(Continued)

(52) U.S. Cl.
CPC ............ *H01L 23/573* (2013.01); *G06F 7/588* (2013.01); *G11C 16/0441* (2013.01); *G11C 16/14* (2013.01); *G11C 17/16* (2013.01); *G11C 17/18* (2013.01); *H01L 23/5226* (2013.01); *H01L 27/0883* (2013.01); *H01L 27/11507* (2013.01); *H01L 27/11529* (2013.01); *H01L 27/11558* (2013.01); *H01L 28/00* (2013.01); *H01L 29/0653* (2013.01); *H01L 29/42328* (2013.01); *H01L 29/42344* (2013.01); *H01L 29/42352* (2013.01); *H01L 29/7841* (2013.01); *G11C 2216/10* (2013.01); *H01L 29/7831* (2013.01); *H01L 29/7833* (2013.01)

(58) Field of Classification Search
CPC ............. H01L 29/0653; H01L 29/7831; H01L 29/7833; H01L 23/573; H01L 23/5226; H01L 27/0883
See application file for complete search history.

(56) References Cited

U.S. PATENT DOCUMENTS

| | | | |
|---|---|---|---|
| 5,202,591 A | 4/1993 | Walden | |
| 6,528,885 B2 * | 3/2003 | Vajana | ................. G06K 19/073 257/750 |

(Continued)

FOREIGN PATENT DOCUMENTS

| | | |
|---|---|---|
| JP | S55160462 | 12/1980 |
| JP | S6364361 | 3/1988 |

(Continued)

*Primary Examiner* — Mark Tornow
(74) *Attorney, Agent, or Firm* — JCIPRNET

(57) ABSTRACT

A semiconductor apparatus with fake functionality includes a logic device and at least one fake device. The logic device is formed on a substrate and turned on by a bias voltage. The fake device is also formed on the substrate. The fake device cannot be turned on by the same bias voltage applied on the logic device.

37 Claims, 8 Drawing Sheets

(51) Int. Cl.
*H01L 27/11507* (2017.01)
*H01L 27/11529* (2017.01)
*H01L 29/423* (2006.01)
*G06F 7/58* (2006.01)
*G11C 17/16* (2006.01)
*G11C 17/18* (2006.01)
*G11C 16/04* (2006.01)
*H01L 27/11558* (2017.01)
*H01L 49/02* (2006.01)
*H01L 29/78* (2006.01)

(56) References Cited

U.S. PATENT DOCUMENTS

| | | | |
|---|---|---|---|
| 7,128,271 B2 | 10/2006 | Kim | |
| 7,166,515 B2 | 1/2007 | Clark, Jr. et al. | |
| 2004/0222466 A1* | 11/2004 | Fried | H01L 29/42384 257/347 |
| 2005/0230787 A1* | 10/2005 | Chow | H01L 21/823814 257/629 |

FOREIGN PATENT DOCUMENTS

| | | |
|---|---|---|
| JP | H02188944 | 7/1990 |
| JP | 2006510225 | 3/2006 |
| JP | 2006332237 | 12/2006 |
| JP | 2008205019 | 9/2008 |
| JP | 2013222929 | 10/2013 |
| JP | 2014053414 | 3/2014 |
| JP | 2014135386 | 7/2014 |

\* cited by examiner

US 10,090,260 B2

SEMICONDUCTOR APPARATUS WITH FAKE FUNCTIONALITY

CROSS-REFERENCE TO RELATED APPLICATION

This application claims the priority benefit of U.S. provisional application Ser. No. 62/322,237, filed on Apr. 13, 2016. The entirety of the above-mentioned patent application is hereby incorporated by reference herein and made a part of this specification.

BACKGROUND OF THE INVENTION

1. Field of the Invention

The present invention generally relates to a semiconductor apparatus, in particular, to a semiconductor device with fake functionality.

2. Description of Related Art

For design and development of semiconductor apparatus, it needs very expensive and longtime research. However, unscrupulous manufacturers may copy or clone the semiconductor's intellectual property by reverse engineering. The reverse engineering, which typically relies primarily on obtaining top view SEM/TEM inspections of a circuit or according to database clone, in essence tries to bypass the typical product development cycles and expenses involved in producing semiconductor device.

Therefore, there is a need in this industry to avoid the reverse engineering by setting some fake devices in the semiconductor apparatus.

SUMMARY OF THE INVENTION

Accordingly, the present invention is directed to a semiconductor apparatus with fake functionality that is hard to distinguish a normal device from a fake device in the semiconductor apparatus.

According to one embodiment of the invention, a semiconductor apparatus with fake functionality includes a logic device and at least one fake device. The logic device and the fake device are formed on a substrate and the logic device is turned on by a bias voltage, in which the fake device cannot be turned on by the same bias voltage applied on the logic device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
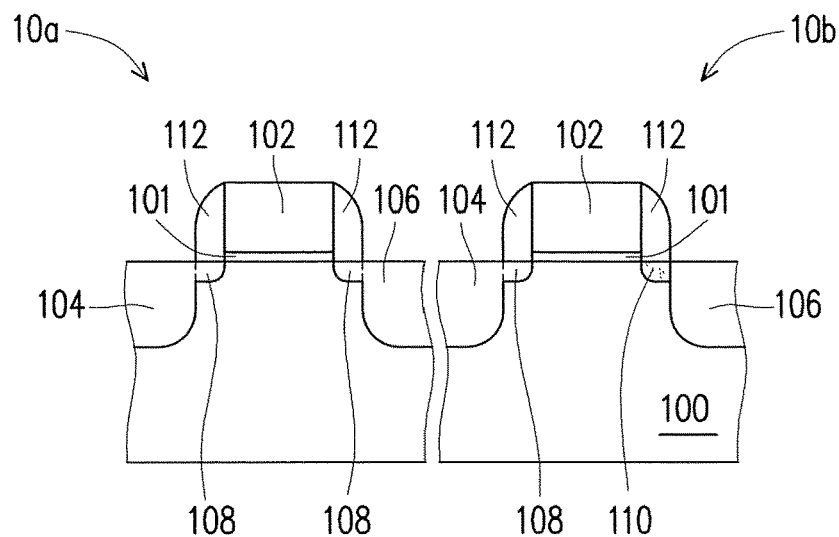
FIG. 1 is a schematic, cross-sectional diagram of a semiconductor apparatus with fake functionality in accordance with a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic, cross-sectional diagram of a semiconductor apparatus with fake functionality in accordance with a first embodiment of this invention.

With reference to FIG. 1, a semiconductor apparatus with fake functionality at least includes a logic device 10*a* and a first fake device 10*b*. The logic device 10*a* is formed on a substrate 100 and turned on by a bias voltage. For example, the logic device 10*a* includes a gate oxide 101, a gate 102, a source 104 and a drain 106 outside the gate 102 in the substrate 100, and first lightly doped drains (LDDs) 108 between the gate 102 and the source 104 and between the gate 102 and the drain 106 respectively. Typically, in the logic device 10*a*, the source 104 and the drain 106 have the same conductive type, and the first LDDs 108 also have the same conductive type as the source 104 and the drain 106. The first fake device 10*b* is formed on the substrate 100, and it cannot be turned on by the same bias voltage applied on the logic device 10*a*. For example, the first fake device 10*b* has a threshold voltage which is twice of that of the logic device 10*a*. In the first embodiment, except for the LDD, the first fake device 10*b* is similar to the logic device 10*a*, and thus it includes the gate 102, the source 104 and the drain 106. In the first fake device 10*b*, the LDD between the gate 102 and the source 104 is the first LDD 108, but the LDD between the gate 102 and the drain 106 is a second LDD 110; vice versa. The first LDD 108 and the second LDD 110 have different conductive types. For example, the first LDD 108 is n-type LDDs (nLDDs), and the second LDD 110 is p-type LDD (pLDD), or vice versa. Thus the first fake device 10b cannot be turned on by the bias voltage and the logic device 10a can be turned on by the same bias voltage. The first LDDs 108 and the second LDD 110 are usually formed underneath the spacers 112, so their doping types with respect to conductive type are also not identified easily. Therefore, it is very hard to distinguish the second LDD 110 from the first LDD 108, the semiconductor apparatus by reverse engineering may be impracticable.

In one embodiment, the logic device 10a has a first threshold voltage (Vth), and the first fake device 10b has a second threshold voltage. If the logic device 10a is nFET, the second threshold voltage may be larger than the first threshold voltage, preferably twice of the first threshold voltage or more. If the logic device 10a is pFET, the second threshold voltage may be smaller than the first threshold voltage.

To implement this fake device 10b, a simple approach is to have some modifications to the nLDD and pLDD masks. For example, an nLDD implant is added in the LDD region 108 of the logic device 10a and fake device 10b, but is blocked in the LDD region 110 of the fake device 10b. And a pLDD implant is intentionally to be added in LDD region 110 of the fake device 10b. All the above actions can be done through the Boolean logic operations on the nLDD and pLDD masks individually.

Figure 2:
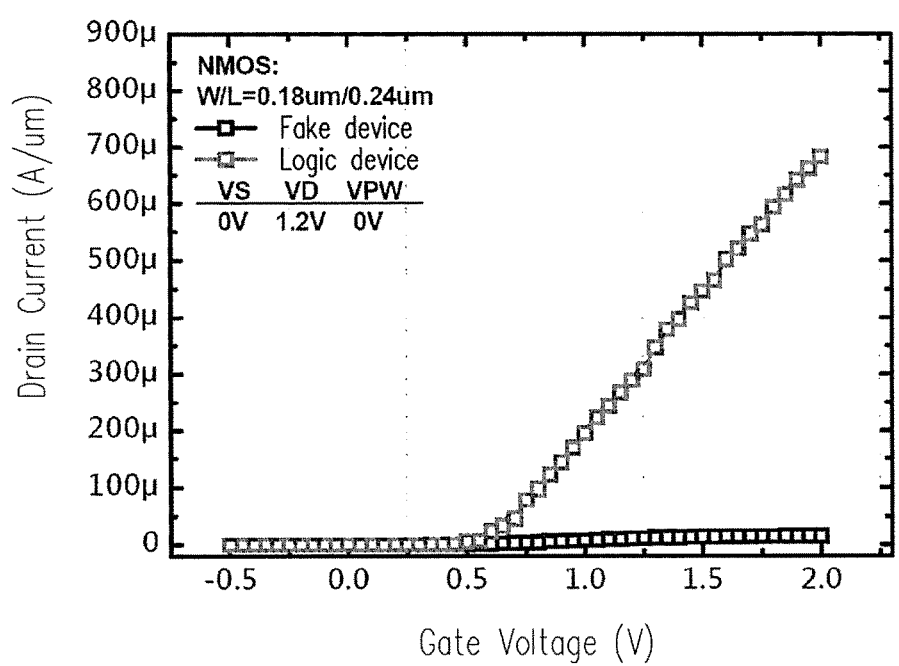
FIG. 2 is a current-voltage (I-V) curve of the semiconductor apparatus with fake functionality of FIG. 1.

FIG. 2 is a current-voltage (I-V) curve of the semiconductor apparatus with fake functionality of FIG. 1. In FIG. 2, the logic device is a NMOS with nLDDs, and the fake device is also a NMOS with a pLDD replacing for one of the nLDDs. Accordingly, the fake device shows much degraded current level when compared to the logic device. The different turn-on characteristics between gate bias and drain turn-on current is very helpful for circuit designers on establishing the firewall for the protection of intelligent property from reverse engineering. Furthermore, the designated circuit functionality is normal or abnormal based on the connection arrangement of the fake devices in this circuit block. Especially, the fake device is invisible from the physical reverse engineering approach and indistinguishable from the normal logic device.

Figure 3:
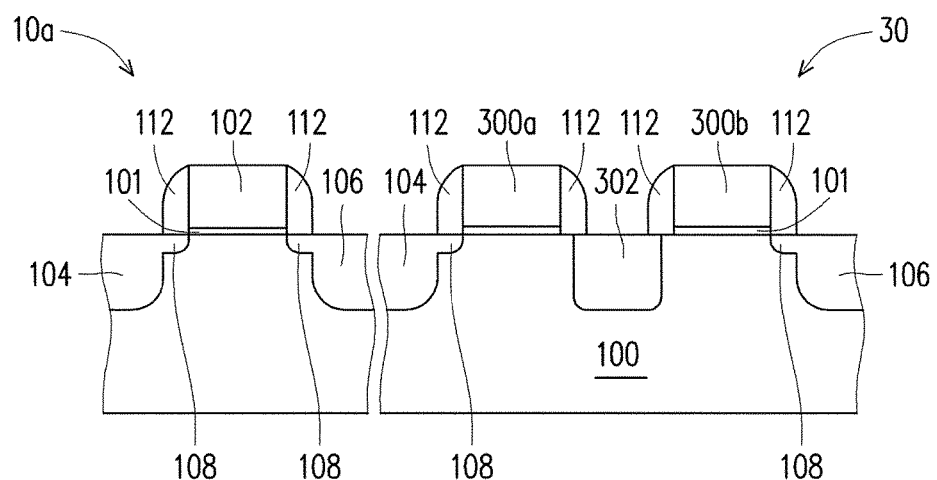
FIG. 3 is a schematic, cross-sectional diagram of a semiconductor apparatus with fake functionality in accordance with a second embodiment of this invention.

FIG. 3 is a schematic, cross-sectional diagram of a semiconductor apparatus with fake functionality in accordance with a second embodiment of this invention.

With reference to FIG. 3, a semiconductor apparatus with fake functionality at least includes a logic device 10a and a first fake device 30. The logic device 10a is the same as that in the first embodiment and thus not repeated herein. The first fake device 30 includes two gates 300a and 300b, a source 104 on a first side of the two gates 300a and 300b, a drain 106 on a second side of the two gates 300a and 300b, and a heavily doped region 302 between the two gates 300a and 300b in the substrate 100. The source 104 and the heavily doped region 302 have different conductive types. For example, the source 104 (and the drain 106) is an n+ region, and the heavily doped region 302 is a p+ region; vice versa. Since the heavily doped region 302 is formed within the channel between the source 104 and the drain 106, it may function as a channel stop such that the first fake device 30 cannot be turned on by the same bias voltage applied on the logic device 10a. As the same as FIG. 1, there are the first LDDs 108 between the gate 300a and the source 104 and between the gate 300b and the drain 106 respectively, wherein the first LDDs 108 may be nLDD if the source 104 and the drain 106 are n+ regions, and the first LDDs 108 may be pLDD if the source 104 and the drain 106 are p+ regions.

The implementation of the channel stop (heavily doped region 302) is very similar to the LDD replacement mentioned in the first embodiment through the Boolean logic operation on the n+ or p+ implant masks.

Figure 4:
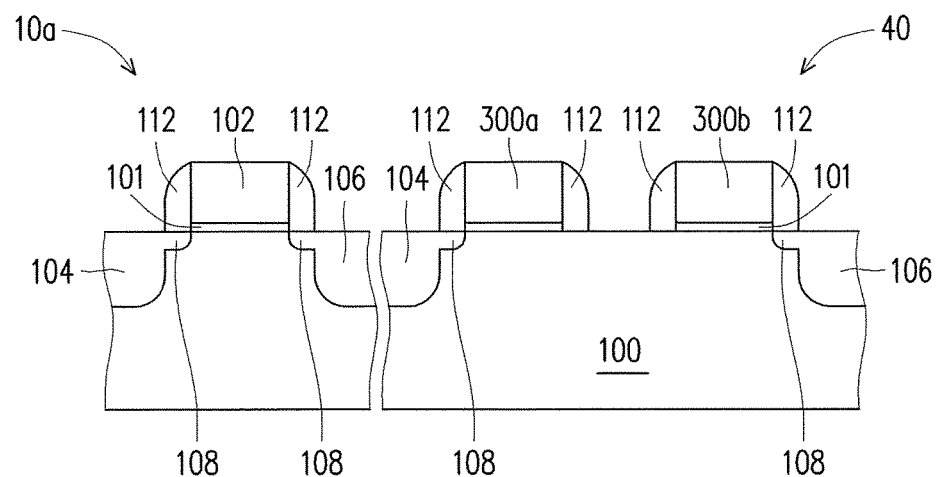
FIG. 4 is a schematic, cross-sectional diagram of a semiconductor apparatus with fake functionality in accordance with a third embodiment of this invention.

FIG. 4 is a schematic, cross-sectional diagram of a semiconductor apparatus with fake functionality in accordance with a third embodiment of this invention.

With reference to FIG. 4, a semiconductor apparatus with fake functionality at least includes a logic device 10a and a first fake device 40. The logic device 10a is the same as that in the first embodiment and thus not repeated herein. The first fake device 40 is similar to the first fake device 30 in the second embodiment, but there is no doping region between the two gates 300a and 300b. In other words, the region between the two gates 300a and 300b is a substantially undoped region as a channel stop, and thus the first fake device 40 cannot be turned on by the same bias voltage applied on the logic device 10a, and thus the difference between the logic device 10a and first fake device 40 cannot be discerned by reverse engineering.

The implementation of the channel stop (undoped region between the gate 300a and 300b) is also very similar to the LDD replacement mentioned in the first embodiment through the Boolean logic operation on the n+ or p+ implant masks.

Figure 5:
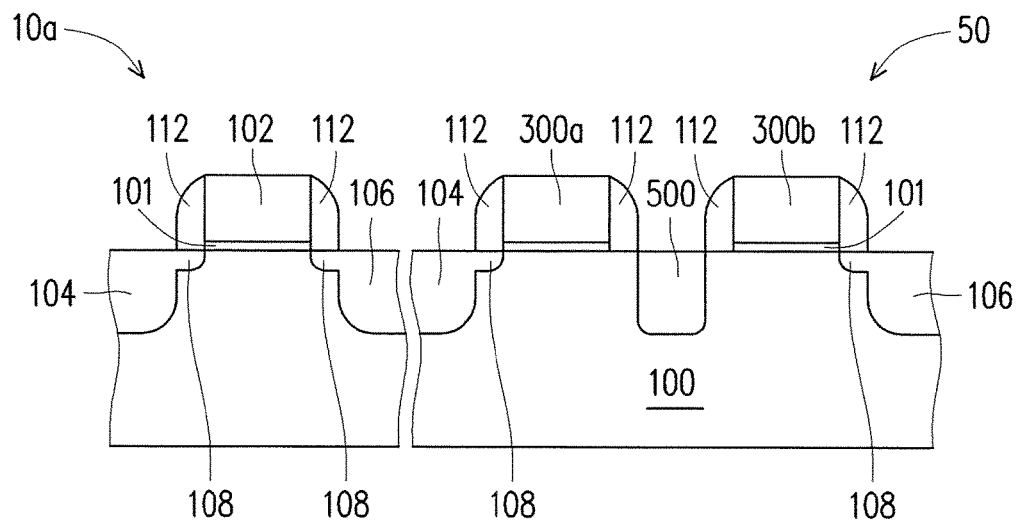
FIG. 5 is a schematic, cross-sectional diagram of a semiconductor apparatus with fake functionality in accordance with a fourth embodiment of this invention.

FIG. 5 is a schematic, cross-sectional diagram of a semiconductor apparatus with fake functionality in accordance with a fourth embodiment of this invention.

With reference to FIG. 5, a semiconductor apparatus with fake functionality at least includes a logic device 10a and a first fake device 50. The logic device 10a is the same as that in the first embodiment and thus not repeated herein. The first fake device 50 is similar to the first fake device 40 in the third embodiment, but there is a heavily doped region 500 between the two gates 300a and 300b and substantially undoped regions between the heavily doped region 500 and the gate 300a and between the heavily doped region 500 and the gate 300b respectively. The heavily doped region 500 may be formed together with the formation of the sources 104 and the drains 106, for instance. Due to the absence of LDDs between the heavily doped region 500 and the gate 300a/300b, the first fake device 50 has a threshold voltage much higher than that of the logic device 10a, and thus the first fake device 50 cannot be turned on by the same bias voltage applied on the logic device 10a.

Figure 6:
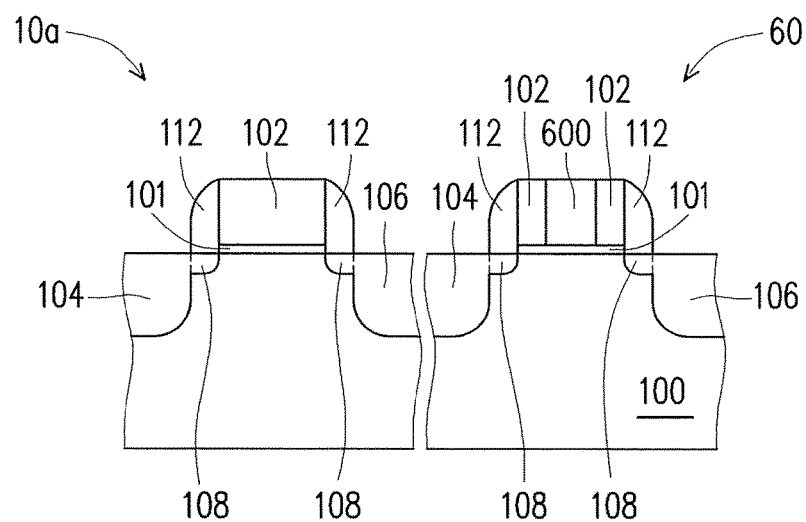
FIG. 6 is a schematic, cross-sectional diagram of a semiconductor apparatus with fake functionality in accordance with a fifth embodiment of this invention.

FIG. 6 is a schematic, cross-sectional diagram of a semiconductor apparatus with fake functionality in accordance with a fifth embodiment of this invention.

With reference to FIG. 6, a semiconductor apparatus with fake functionality at least includes a logic device 10a and a first fake device 60. The logic device 10a is the same as that in the first embodiment and thus not repeated herein. The first fake device 60 is similar to the logic device 10a, but there is a heavily and counter-doped region 600 in the middle of the gate 102 between the source 104 and the drain 106. Therefore, the local Vth of the first fake device 60 may be increased and larger than that of the logic device 10a. In particular, the heavily and counter-doped region 600 and the source 104 have different conductive types, and thus the first fake device 60 cannot be turned on by the same bias voltage applied on the logic device 10a due to the bandgap difference. For example, if the source 104 is an n+ region, the heavily and counter-doped region 600 is a p+ region; vice versa. Moreover, the counter-doped region 600 is preferably disposed in a middle of the gate 102.

Figure 7:
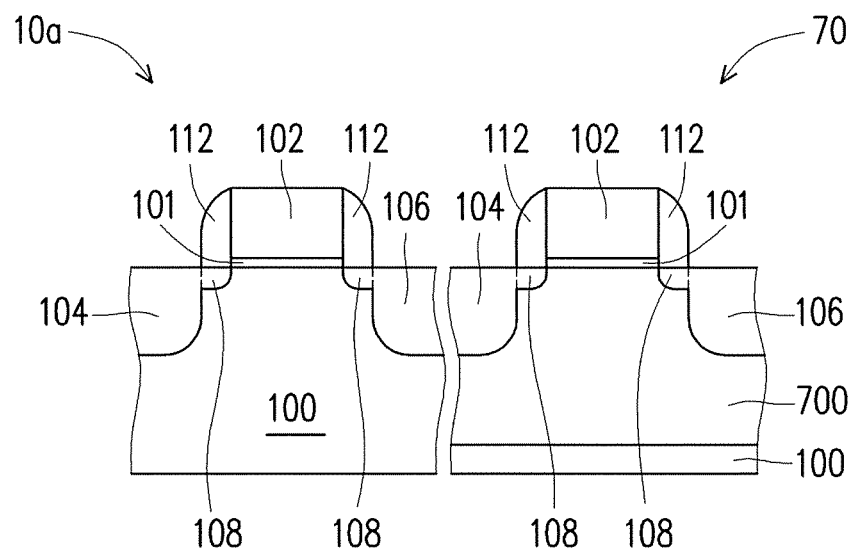
FIG. 7 is a schematic, cross-sectional diagram of a semiconductor apparatus with fake functionality in accordance with a sixth embodiment of this invention.

FIG. 7 is a schematic, cross-sectional diagram of a semiconductor apparatus with fake functionality in accordance with a sixth embodiment of this invention.

With reference to FIG. 7, a semiconductor apparatus with fake functionality at least includes a logic device 10a, a first fake device (not shown), and a second fake device 70. The logic device 10a is the same as that in the first embodiment and thus not repeated herein. The first fake device may be selected from at least one of above embodiments and thus not repeated herein. The second fake device 70 includes a gate 102, a well 700 in the substrate 100, a source 104 in the well 700 on a first side of the gate 102, and a drain 106 in the well 700 on a second side of the gate 102. The well 700 and the substrate 100 have different conductive types. For example, each of the source 104 and the drain 106 is an n type region, the substrate 100 is a p type substrate and the well 700 is an N well; vice versa. In other words, the well 700, the source 104 and the drain 106 have the same conductive type, and thus the second fake device 70 has weak gate controllability.

Figure 8:
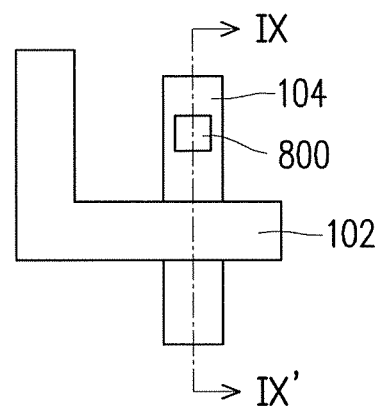
FIG. 8 is a plan view of a semiconductor apparatus with fake functionality in accordance with a seventh embodiment of this invention.
Figure 9A:
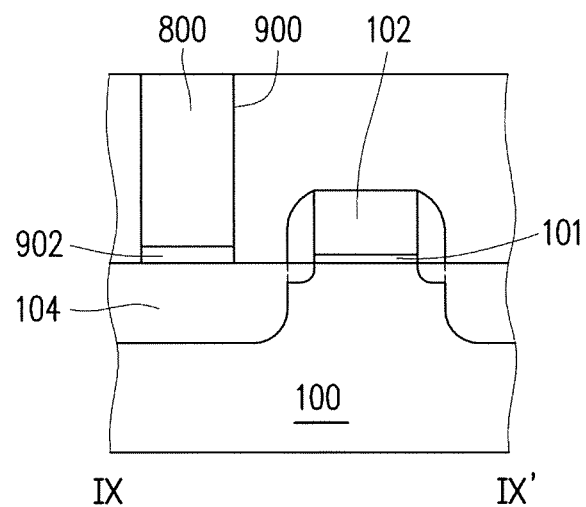
FIG. 9A is a schematic, cross-sectional diagram of the semiconductor apparatus with fake functionality of FIG. 8.
Figure 9B:
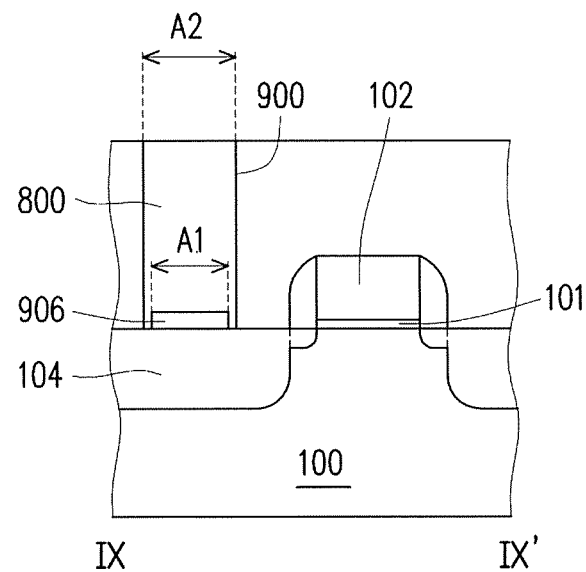
FIG. 9B is a schematic, cross-sectional diagram of anther exemplary embodiment of the semiconductor apparatus with fake functionality of FIG. 8.

FIG. 8 is a plan view of a semiconductor apparatus with fake functionality in accordance with a seventh embodiment of this invention. FIGS. 9A and 9B are two different cross-sectional exemplary diagrams taken along a sectional line IX-IX' depicted in FIG. 8.

With reference to FIG. 8, FIG. 9A and FIG. 9B, a contact plug 800 may be disposed in a contact hole 900 for connecting the source 104 of a logic device. If the contact plug 800 is designed to be open as shown in FIG. 9A, an insulation structure 902 may be disposed intentionally between the contact plug 800 and the source 104 in the contact hole 900. The contact plug etching will be stopped in the insulation structure 902 due to the etching selectivity and etching rate issue. The insulation structure 902 is, for example, an oxide layer such as RPO (resistive protection oxide), so its manufacture process can be integrated with normal process for logic device without any process steps modification. Alternatively, If the contact plug 800 is designed to be connected to the source 104 as shown in FIG. 9B, a cross sectional area A1 of the insulation structure 906 can be controlled to be less than a cross sectional area A2 of the contact plug 800, for example. The etching rate for the cross sectional area A2 will be higher than that for the A1, then the insulating structure 906 will be etched away. The contact plug 800 will directly connect to the source region 104. Either the situation in FIG. 9A or the situation in FIG. 9B are difficult to identify according to reverse engineering.

Figure 10:
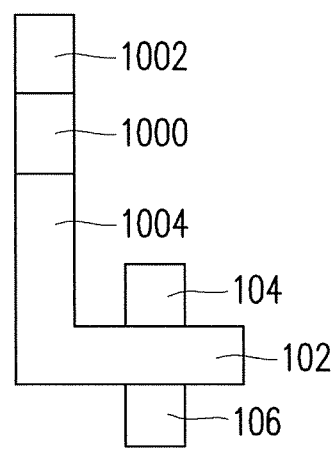
FIG. 10 is a schematic, cross-sectional diagram of a semiconductor apparatus with fake functionality in accordance with an eighth embodiment of this invention.

FIG. 10 is a schematic, cross-sectional diagram of a semiconductor apparatus with fake functionality in accordance with an eighth embodiment of this invention.

A third fake device is shown in FIG. 10. The third fake device may be a poly silicon structure used as the gate 102 in above embodiments. The source 104 and the drain 106 are outside the gate 102. There exists an undoped region 1000, an n+ type region 1002 and a p+ type region 1004 in the gate 102, so they act as a semiconductor diode resulting in the voltage rectifying purpose. Moreover, the voltage will be blocked and cannot be transferred from one terminal to the other terminal if the terminals are not connected correctly. The semiconductor device which is underneath the gate 102 will have abnormal device characteristics, even this device cannot be turned on.

Figure 11:
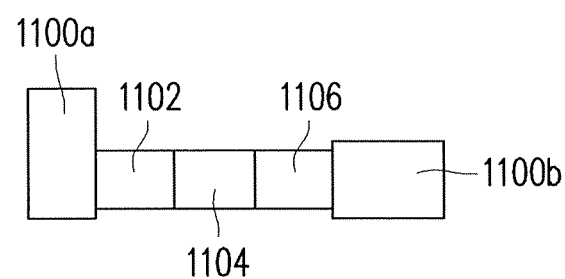
FIG. 11 is a schematic, cross-sectional diagram of a semiconductor apparatus with fake functionality in accordance with a ninth embodiment of this invention.

FIG. 11 is a schematic, cross-sectional diagram of a semiconductor apparatus with fake functionality in accordance with a ninth embodiment of this invention.

In FIG. 11, numeral 1100a represents the logic device, and numeral 1100b represents the fake device in one of above embodiments. An interconnection is disposed for connecting the logic device 1100a and the fake device 1100b, wherein the interconnection is a diode including an n+ type region 1102, an undoped region 1104 and a p+ type region 1106. Accordingly, the interconnection has high resistance and can be used to block the signal transferring.

Figure 12:
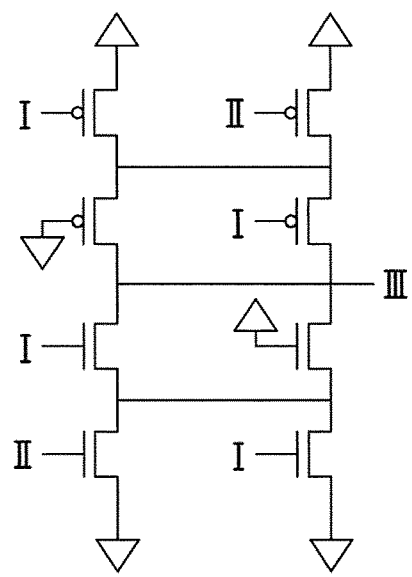
FIG. 12 is a circuit diagram illustrating an example of a semiconductor apparatus having a number of devices, in which the fake devices of this invention are contained.

FIG. 12 is a circuit diagram illustrating an example of a semiconductor apparatus having a number of devices, in which the fake devices of this invention are contained.

In FIG. 12, the fake devices in above embodiments are indistinguishable from the normal logic devices, so the circuit diagram obtained by reverse engineering cannot work. In detail, if a hacker tries to copy the semiconductor apparatus of this example by reverse engineering, the circuit diagram would be shown as FIG. 12. However, according to the circuit diagram of FIG. 12, the circuit constituted by normal logic devices will not work. The truth table for this circuit block is as following table 1, wherein "I" and "II" represent input logic states; "III" represents output logic state; "x" represents fighting in the output logic state.

TABLE 1

| I | II | III |
|---|----|-----|
| 0 | 0  | 1   |
| 0 | 1  | x   |
| 1 | 0  | x   |
| 1 | 1  | 0   |

According to table 1, it shows that the circuit functionality will be not stabilized in determined state for the circuit block without incorporating the suitable fake devices. This is because the output in "III" will find fighting condition at (I, II)=(1, 0) or (0, 1) case. If fighting, the output of the circuit may be error and large leakage may be occurred. As a result, the entire IC chip cannot work and thus cannot be sold to end customers.

Figure 13:
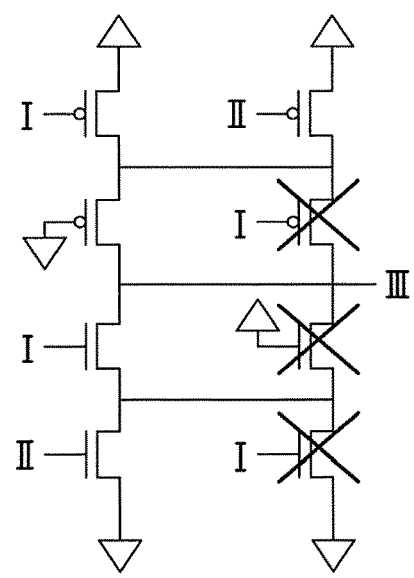
FIG. 13 is a circuit diagram illustrating a correct NAND circuit according to the semiconductor apparatus of FIG. 12.

FIG. 13 is a circuit diagram illustrating a correct NAND circuit according to the semiconductor apparatus of FIG. 12, in which the fake devices in embodiments of this invention are contained for performing the NAND circuit.

In FIG. 13, there are three devices as the fake device represented by "X". The truth table for this circuit block is as following table 2. The fake devices cannot be turned on based on by the same bias voltage applied on other devices. For example, the fake devices "X" may have the threshold voltage much higher than other devices, or they include the channel stop illustrated as the fake devices 10a, 30, 40 or 50 in FIG. 1, 3, 4 or 5 respectively. Therefore, it has correct NAND function.

TABLE 2

| I | II | III |
|---|----|-----|
| 0 | 0  | 1   |
| 0 | 1  | 1   |
| 1 | 0  | 1   |
| 1 | 1  | 0   |

Figure 14:
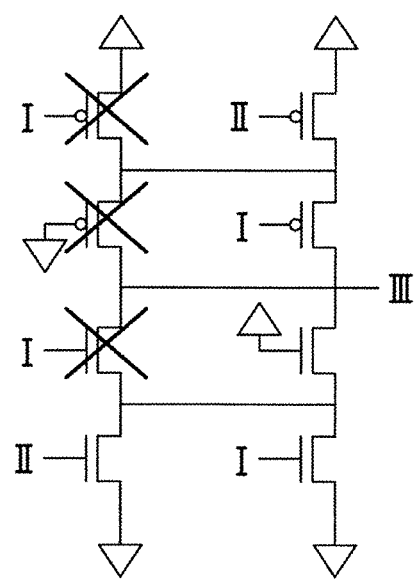
FIG. 14 is a circuit diagram illustrating a correct NOR circuit according to the semiconductor apparatus of FIG. 12.

FIG. 14 is a circuit diagram illustrating a correct NOR circuit according to the semiconductor apparatus of FIG. 12, in which the fake devices in embodiments of this invention are contained for performing the NOR circuit.

In FIG. 14, there are three devices as the fake device represented by "X". The truth table for this circuit block is as following table 3. The fake devices cannot be turned on by the same bias voltage applied on other devices. For example, the fake devices "X" may have the threshold voltage much higher than other devices, or they include the channel stop illustrated as the fake devices 10a, 30, 40 or 50 in FIG. 1, 3, 4 or 5 respectively. Therefore, it has correct NOR function.

TABLE 3

| I | II | III |
|---|----|-----|
| 0 | 0  | 1   |
| 0 | 1  | 0   |
| 1 | 0  | 0   |
| 1 | 1  | 0   |

Moreover, if the logic device and the fake device have the same dimension, size or shape, it can be manufactured by modifying the Boolean logic operation of the mask patterns without adding extra mask. For example, the implantation composition of the logic device can be changed to different conductive type in order to form the fake device without extra mask, and the difference in conductive type is difficult to check by reverse engineering. No extra process or manufacturing cost will be incurred to customers.

In summary, the semiconductor apparatuses of the above embodiments feature in hiding the fake devices to confuse the reverse engineers and further affect their product resulting in their goodwill loss.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor apparatus with fake device, comprising:
   a logic device, formed on a substrate, wherein the logic device is turned on by a bias voltage; and
   a first fake device, formed on the substrate, wherein the first fake device cannot be turned on by the same bias voltage applied on the logic device,
   wherein the first fake device comprises two gates without a doped region between the two gates in the substrate, a source on a first side of the two gates, and a drain on a second side of the two gates, wherein the source and the drain have the same conductive type.

2. The semiconductor apparatus with fake functionality according to claim 1, further comprising a plurality of first LDDs between the source and the first side and between the drain and the second side respectively.

3. The semiconductor apparatus with fake functionality according to claim 2, wherein the plurality of first LDDs is nLDD, and the source and the drain are n+ regions.

4. The semiconductor apparatus with fake functionality according to claim 2, wherein the plurality of first LDDs is pLDD, and the source and the drain are p+ regions.

5. The semiconductor apparatus with fake functionality according to claim 1, further comprises a second fake device formed in the substrate, and the second fake device comprises a gate, a well in the substrate, a source in the well on a first side of the gate, and a drain in the well on a second side of the gate, and the well and the substrate have different conductive types.

6. The semiconductor apparatus with fake functionality according to claim 5, wherein the substrate is a p type substrate and the well is an N well, or vice versa.

7. The semiconductor apparatus with fake functionality according to claim 1, further comprises a contact plug in a contact hole for connecting the logic device, and an insulation structure between the contact plug and the logic device in the contact hole.

8. The semiconductor apparatus with fake functionality according to claim 7, wherein a cross sectional area of the insulation structure is less than that of the contact plug.

9. The semiconductor apparatus with fake functionality according to claim 7, wherein the insulation structure is an oxide layer.

10. The semiconductor apparatus with fake functionality according to claim 1, further comprises a third fake device formed on the substrate, wherein the third fake device comprises a poly silicon structure in which has a substantially undoped region.

11. The semiconductor apparatus with fake functionality according to claim 1, further comprises an interconnection for connecting at least one of the logic device and the first fake device, wherein the interconnection is a poly silicon line in which has a substantially undoped region.

12. The semiconductor apparatus with fake functionality according to claim 1, wherein the logic device has a first threshold voltage and the first fake device has a second threshold voltage that is twice of the first threshold voltage or more.

13. The semiconductor apparatus with fake functionality according to claim 1, wherein the logic device and the fake device has the same dimension, size or shape.

14. A semiconductor apparatus with fake device, comprising:
   a logic device, formed on a substrate, wherein the logic device is turned on by a bias voltage; and
   a first fake device, formed on the substrate, wherein the first fake device cannot be turned on by the same bias voltage applied on the logic device,
   wherein the first fake device comprises a first gate, a second gate, a source on a first side of the first gate, a drain on a second side of the second gate, a heavily doped region between the first gate and the second gate, a plurality of first LDDs between the source and the first gate and between the drain and the second gate, and a plurality of substantially undoped regions between the heavily doped region and the first gate and between the heavily doped region and the second gate respectively,
   wherein the plurality of substantially undoped regions are in physical contact with the heavily doped region, and the source and the drain have the same conductive type.

15. The semiconductor apparatus with fake functionality according to claim 14, wherein the plurality of first LDDs is nLDD, and the source, the drain and the heavily doped region are n+ regions.

16. The semiconductor apparatus with fake functionality according to claim 14, wherein the plurality of first LDDs is pLDD, and the source, the drain and the heavily doped region are p+ regions.

17. The semiconductor apparatus with fake functionality according to claim 14, further comprises a second fake device formed in the substrate, and the second fake device comprises a gate, a well in the substrate, a source in the well on a first side of the gate, and a drain in the well on a second side of the gate, and the well and the substrate have different conductive types.

18. The semiconductor apparatus with fake functionality according to claim 17, wherein the substrate is a p type substrate and the well is an N well, or vice versa.

19. The semiconductor apparatus with fake functionality according to claim 14, further comprises a contact plug in a contact hole for connecting the logic device, and an insulation structure between the contact plug and the logic device in the contact hole.

20. The semiconductor apparatus with fake functionality according to claim 19, wherein a cross sectional area of the insulation structure is less than that of the contact plug.

21. The semiconductor apparatus with fake functionality according to claim 19, wherein the insulation structure is an oxide layer.

22. The semiconductor apparatus with fake functionality according to claim 14, further comprises a third fake device formed on the substrate, wherein the third fake device comprises a poly silicon structure in which has a substantially undoped region.

23. The semiconductor apparatus with fake functionality according to claim 14, further comprises an interconnection for connecting at least one of the logic device and the first fake device, wherein the interconnection is a poly silicon line in which has a substantially undoped region.

24. The semiconductor apparatus with fake functionality according to claim 14, wherein the logic device has a first threshold voltage and the first fake device has a second threshold voltage that is twice of the first threshold voltage or more.

25. The semiconductor apparatus with fake functionality according to claim 14, wherein the logic device and the fake device has the same dimension, size or shape.

26. A semiconductor apparatus with fake device, comprising:
   a logic device, formed on a substrate, wherein the logic device is turned on by a bias voltage; and
   a first fake device, formed on the substrate, wherein the first fake device cannot be turned on by the same bias voltage applied on the logic device,
   wherein the first fake device comprises a gate, a source on a first side of the gate, a drain on a second side of the gate, a channel below the gate in the substrate, and a heavily and counter-doped region in the gate on the channel, the heavily and counter-doped region and the source have different conductive types, and the heavily and counter-doped region is in physical contact with the gate.

27. The semiconductor apparatus with fake functionality according to claim 26, wherein the source is an n+ region and the heavily and counter-doped region is a p+ region, or vice versa.

28. The semiconductor apparatus with fake functionality according to claim 26, wherein the heavily and counter-doped region is disposed in a middle of the gate.

29. The semiconductor apparatus with fake functionality according to claim 26, further comprises a second fake device formed in the substrate, and the second fake device comprises a gate, a well in the substrate, a source in the well on a first side of the gate, and a drain in the well on a second side of the gate, and the well and the substrate have different conductive types.

30. The semiconductor apparatus with fake functionality according to claim 29, wherein the substrate is a p type substrate and the well is an N well, or vice versa.

31. The semiconductor apparatus with fake functionality according to claim 26, further comprises a contact plug in a contact hole for connecting the logic device, and an insulation structure between the contact plug and the logic device in the contact hole.

32. The semiconductor apparatus with fake functionality according to claim 31, wherein a cross sectional area of the insulation structure is less than that of the contact plug.

33. The semiconductor apparatus with fake functionality according to claim 31, wherein the insulation structure is an oxide layer.

34. The semiconductor apparatus with fake functionality according to claim 26, further comprises a third fake device formed on the substrate, wherein the third fake device comprises a poly silicon structure in which has a substantially undoped region.

35. The semiconductor apparatus with fake functionality according to claim 26, further comprises an interconnection for connecting at least one of the logic device and the first fake device, wherein the interconnection is a poly silicon line in which has a substantially undoped region.

36. The semiconductor apparatus with fake functionality according to claim 26, wherein the logic device has a first threshold voltage and the first fake device has a second threshold voltage that is twice of the first threshold voltage or more.

37. The semiconductor apparatus with fake functionality according to claim 26, wherein the logic device and the fake device has the same dimension, size or shape.

* * * * *